United States Patent
Inoue et al.

(10) Patent No.: US 9,196,507 B1
(45) Date of Patent: Nov. 24, 2015

(54) SEMICONDUCTOR DEVICE, SEMICONDUCTOR STACKED MODULE STRUCTURE, STACKED MODULE STRUCTURE AND METHOD OF MANUFACTURING SAME

(71) Applicants: Hiroshi Inoue, Yokohama (JP); Akio Katsumata, Yokohama (JP); Shigenori Sawachi, Yokohama (JP); Osamu Yamagata, Yokohama (JP)

(72) Inventors: Hiroshi Inoue, Yokohama (JP); Akio Katsumata, Yokohama (JP); Shigenori Sawachi, Yokohama (JP); Osamu Yamagata, Yokohama (JP)

(73) Assignee: J-DEVICES CORPORATION, Usuki-shi, Oita (JP)

( * ) Notice: Subject to any disclaimer, the term of this patent is extended or adjusted under 35 U.S.C. 154(b) by 0 days.

(21) Appl. No.: 14/807,193

(22) Filed: Jul. 23, 2015

Related U.S. Application Data

(62) Division of application No. 14/190,885, filed on Feb. 26, 2014.

(51) Int. Cl.
| H01L 21/00 | (2006.01) |
| H01L 23/02 | (2006.01) |
| H01L 21/48 | (2006.01) |
| H01L 21/82 | (2006.01) |
| H01L 23/00 | (2006.01) |

(52) U.S. Cl.
CPC .......... *H01L 21/486* (2013.01); *H01L 21/4853* (2013.01); *H01L 21/4857* (2013.01); *H01L 21/82* (2013.01); *H01L 24/83* (2013.01); *H01L 24/97* (2013.01)

(58) Field of Classification Search
CPC .......................... H01L 21/486; H01L 25/0657
USPC ........................................... 438/109; 257/686
See application file for complete search history.

(56) References Cited

U.S. PATENT DOCUMENTS

| 7,981,722 B2 * | 7/2011 | Yamagata | ............ H01L 23/5389 257/E21.499 |
| 2010/0213599 A1 * | 8/2010 | Watanabe | ............... H01L 23/13 257/693 |
| 2015/0243632 A1 * | 8/2015 | Inoue | .................. H01L 25/0657 257/774 |

FOREIGN PATENT DOCUMENTS

| JP | 2003-197662 A | 7/2003 |
| JP | 2008-218505 A | 9/2008 |
| JP | 2010-219489 A | 9/2010 |
| JP | 2010-278334 A | 12/2010 |

* cited by examiner

Primary Examiner — Calvin Lee
(74) Attorney, Agent, or Firm — Flynn, Thiel, Boutell & Tanis, P.C.

(57) ABSTRACT

A method of manufacturing a semiconductor device having an insulating substrate, a semiconductor element which is mounted on one main surface of the insulating substrate via adhesive, with an element circuit surface of the semiconductor element facing upwards, a first insulating material layer (A) which seals the element circuit surface of the semiconductor element and the insulating substrate peripheral thereto, a first metal thin film wire layer provided on the first insulating material layer (A) and a portion of which is exposed to an external surface, a first insulating material layer (B) provided on the first metal thin film wire layer, a second insulating material layer provided on a main surface of the insulating substrate where the semiconductor element is not mounted, a second metal thin film wire layer provided inside the second insulating material layer.

1 Claim, 11 Drawing Sheets

SEMICONDUCTOR DEVICE, SEMICONDUCTOR STACKED MODULE STRUCTURE, STACKED MODULE STRUCTURE AND METHOD OF MANUFACTURING SAME

This is a divisional of prior U.S. application Ser. No. 14/190,885, filed Feb. 26, 2014.

BACKGROUND OF THE INVENTION

1. Field of the Invention

The present invention relates to a semiconductor device, a semiconductor stacked module structure, a stacked module structure and a method for manufacturing same. More specifically, the present invention relates to a panel scale fan-out package structure in which a thin film wiring step and an assembly step are carried out on a large panel scale, and more particularly, is applicable to a semiconductor stacked module having a structure in which a plurality of packages are stacked vertically.

2. Description of the Related Art

Recent years have seen demands for higher functionality and reduced size and weight in electronic equipment, and accordingly, progress has been made in the high-density integration of electronic components and also in high-density mounting, and semiconductor devices used in such electronic equipment have also been becoming increasingly compact in size more than before.

As a method for manufacturing a semiconductor device such as an LSI unit or an IC module, firstly, a plurality of semiconductor elements judged to be good quality by an electrical properties test are arranged and bonded in a prescribed configuration on a supporting plate, with the element circuit surface facing downwards, whereupon, for instance, a resin sheet is arranged thereon and molded by applying heat and pressure, thereby sealing the plurality of semiconductor elements in a lump, whereupon the supporting plate is peeled away, the resin sealed body is cut and machined to a prescribed shape (for example, a circular shape), an insulating material layer is formed on the element circuit surfaces of the semiconductor elements buried in the sealed resin body, openings are formed in accordance with the positions of the electrode pads of semiconductor elements on the insulating material layer, and a wiring layer is then formed on top of the insulating material layer, in addition to which conducting sections (via sections) connected to the electrode pads of the semiconductor elements are formed inside the openings, whereupon a solder resist layer is formed, solder balls, which are to be external electrode terminals, are formed successively, and each semiconductor element is then cut out individually, one by one, to complete the semiconductor devices (for example, see Japanese Patent Publication No. 2003-197662).

However, in a conventional semiconductor device obtained in this way, when sealing with resin the plurality of semiconductor elements all together, the resin contracts upon curing and since the amount of contraction does not necessarily comply with the design, the positions after curing of the resin may deviate from the design positions, depending on the arrangement positions of the semiconductor elements, and in the semiconductor elements having positional deviation of this kind, positional deviation occurs between the via sections formed in the openings of the insulating material layer and the electrode pads of the semiconductor elements, and hence there is a problem in that connection reliability declines.

A semiconductor device which resolves this problem is described in Japanese Patent Publication No. 2010-219489. FIG. 8 shows the basic structure of this device.

The semiconductor device 30 comprises a flat plate 31 constituted by a cured resin body or metal, a semiconductor element 32 being disposed with an element circuit surface facing upwards, on one main surface of the flat plate 31, and the surface on the opposite side to the element circuit surface (rear surface) being fixed to the flat plate 31 by adhesive 33. Only one insulating material layer 34 is formed on whole of the main surface of the flat plate 31 so as to cover the element circuit surface of the semiconductor element 32. A wiring layer 35 made from a conductive metal, such as copper, is formed on top of this single insulating material layer 34, and one portion thereof is extracted to a peripheral region of the semiconductor element 32. Furthermore, a via section 36 which electrically connects an electrode pad (not illustrated) of the semiconductor element 32 and the wiring layer 35 is formed on the insulating material layer 34 formed on top of the element circuit surface of the semiconductor element 32. This via section 36 is formed in an integrated fashion, together with the wiring layer 35. Moreover, a plurality of solder balls 37 which are external-electrodes are formed at prescribed positions on the wiring layer 35. Furthermore, a protective layer such as a solder resist layer 38 is formed on top of the insulating material layer 34, and on top of the wiring layer 35 apart from the junctions with the solder balls 37.

The semiconductor device according to Japanese Patent Publication No. 2010-219489 has high connection reliability between the electrodes of the semiconductor element and the wiring layer, by means of the composition described above, and enables a semiconductor device which is compatible with miniaturization of the electrodes to be obtained inexpensively with a high yield rate.

However, with the semiconductor device described in Japanese Patent Publication No. 2010-219489, it is difficult to provide vias which pass through the package from the front side to the rear side thereof, and therefore it has been impossible to apply to stacked modules having a three-dimensional structure, which have been expanding rapidly in recent years and in which a semiconductor package or circuit substrate is stacked on another semiconductor package.

According to recent trends, there have been demands for further reduction in semiconductor package size and increase in the number of mounted semiconductor elements, and in response to these demands, a semiconductor apparatus having a package on package (POP) structure (Japanese Patent Publication No. 2008-218505), and a semiconductor apparatus having a through silicon via (TSV) structure (Japanese Patent Publication No. 2010-278334) have been proposed and developed, in which a semiconductor package or circuit substrate is stacked on another semiconductor package.

A semiconductor device having a conventional POP structure is now described on the basis of FIG. 9. The package on package (POP) is a package format in which a plurality of different LSIs are respectively assembled in individual packages, and after testing, these packages are stacked together.

A semiconductor device 40 is formed by stacking one semiconductor package 42 on another semiconductor package 41. A semiconductor element 44 is mounted on top of the substrate 43 of the lower-side semiconductor package 41, and an electrode pad (not illustrated) formed in a peripheral portion of the semiconductor element 44, and an electrode pad 45 on the substrate are electrically connected by a wire 46. The whole surface of the semiconductor element 44 is sealed with a sealing member 47. The semiconductor package 41 and the semiconductor package 42 are electrically connected to each other by reflow via an external connection terminal 48 (solder ball) formed on the lower surface of the semiconductor package 42.

A POP structure has advantages in that a larger mounting surface area can be ensured when mounting equipment, by stacking a plurality of packages as described above, and furthermore, production losses can be reduced since the respective packages can be tested individually. However, since the POP structure is formed by assembling packages individually and stacking these individually assembled packages, then it is difficult to reduce assembly costs by reducing (shrinking) the size of the semiconductor elements, and the assembly costs of the stacked module are very high indeed.

Next, a semiconductor device having a conventional TSV structure will be described with reference to FIG. 10. As shown in FIG. 10, the semiconductor device 50 has a structure in which a plurality of semiconductor elements 51, each having the same function and structure and each manufactured using the same manufacturing mask, and one interposer substrate 52, are stacked via a resin layer 53. The semiconductor element 51 is a semiconductor element using a silicon substrate, which is connected electrically to semiconductor elements adjacent thereabove and therebelow by a plurality of through electrodes (TSV: through silicon via) 54 passing through the silicon substrate, and furthermore is sealed by a sealing resin 55. On the other hand, the interposer substrate 52 is a circuit substrate made of resin and a plurality of external connection terminals (solder balls) 56 are formed on the rear surface thereof.

In a conventional through silicon via (TSV) stacked module structure, there is a possibility that the semiconductor element may be damaged due to the provision of through holes in each of the individual semiconductor elements, and it is necessary to add a plurality of complicated and expensive wafer steps, such as a step for forming via electrodes inside the through holes, thus leading to significant cost increases for the overall vertical stacked module. Furthermore, with a conventional structure, it has been difficult to achieve stacked mounting including chips of different sizes, and due to the "provision of a different rewiring layer for each layer" which is essential when stacking the same chips such as in a memory, the manufacturing costs are much higher than in a normal memory module, and there has been a problem in that price reduction due to the effects of mass production is not expected to a great extent.

3. Problem to be Solved by the Invention

In order to resolve the conventional problems described above, the present inventors, and others, carried out thorough research with the aim of providing a semiconductor device having a structure including electrodes which pass from the front to the rear surface, in which a vertically stacked structure, such as a POP structure, is possible, and LSI chips of different sizes can easily be stacked vertically.

As a result of this, the inventors discovered that the problems described above can be resolved by a semiconductor device, as shown in FIG. 7, having: an organic substrate 1; a through via 4 passing through the organic substrate 1 in the thickness direction; an external electrode 5b and an internal electrode 5a electrically connected to the through via 4, provided on both surface of the organic substrate 1; a semiconductor element 2 mounted with the element circuit surface facing upwards, on one main surface of the organic substrate 1, via an adhesive layer 3; an insulating material layer 6 which seals the semiconductor element 2 and periphery thereof; a metal thin film wiring layer 7 which is provided in the insulating material layer 6 and one portion of which is exposed on an external surface; a metal via 10, electrically connected to the metal thin film wiring layer 7; and an external electrode 9 formed on the metal thin film wiring layer 7; having a structure in which the metal thin film wiring layer 7 electrically connects an electrode arranged on the element circuit surface of the semiconductor element 2, the internal electrodes 5a, the metal via 10, and the external electrode 9 formed on the metal thin film wiring layer 7 (Japanese Patent Application No. 2011-165200: not published). This semiconductor device has excellent beneficial effects in that it enables a vertical stacked structure, such as a POP structure, and furthermore, permits LSI chips having no through electrodes to be easily stacked vertically, and so on.

However, further study carried out by the present inventors and others found that the module structure relating to the invention described above requires, as preparation for producing a semiconductor device, the production of a semiconductor device to be mounted and an organic substrate which is patterned with metal wiring that corresponds to components (including semiconductor devices) to be stacked on the semiconductor device, and also found that the structure requires further improvement to conform to the needs for wider application. Furthermore, it is necessary to provide a protective film on the surface layer in order to prevent damages to the organic substrate during the production process, the structure requires further improvement to conform to the needs for simplification of the production process.

Therefore, the object of the present invention is to provide a semiconductor device, a semiconductor stacked module structure, a stacked module structure and a method of manufacturing these, having excellent general applicability, and having a structure including electrodes which pass from the front to the rear surface, in which a vertically stacked structure, such as a POP structure, is possible, and LSI chips of different sizes can easily be stacked vertically.

SUMMARY OF THE INVENTION

The present invention is as indicated below.
(1) A semiconductor device, having:
an insulating substrate;
a semiconductor element which is mounted on one main surface of the insulating substrate via adhesive, with an element circuit surface of the semiconductor element facing upwards;
a first insulating material layer (A) which seals the element circuit surface of the semiconductor element and the insulating substrate peripheral thereto;
a first metal thin film wire layer which is provided on the first insulating material layer (A) and a portion of which is exposed to an external surface;
a first insulating material layer (B) which is provided on the first metal thin film wire layer;
a second insulating material layer which is provided on a main surface of the insulating substrate where the semiconductor element is not mounted;
a second metal thin film wire layer which is provided inside the second insulating material layer and a portion of which is exposed to an external surface;
a via which passes through the insulating substrate and which electrically connects the first metal thin film wire layer in the first insulating material layer (A) and the second metal thin film wire layer; and
an external electrode which is formed on the first metal thin film wire layer,
the semiconductor device having a structure in which the second metal thin film wire layer, an electrode arranged on the element circuit surface of the semiconductor element, the first metal thin film wire layer, the via and the external electrode formed on the first metal thin film wire layer are electrically connected.

(2) The semiconductor device according to (1) above, wherein the first insulating material layer (A) and the first insulating material layer (B) are insulating materials different from each other.

(3) The semiconductor device according to (1) or (2) above, having a first metal thin film wire layer which is electrically connected to the second metal thin film wire layer and is not electrically connected to the semiconductor element.

(4) The semiconductor device according to any of (1) to (3) above, wherein a plurality of the first metal thin film wire layers are provided, and a plurality of the vias which establish connection between the plurality of the first metal thin film wire layers are provided.

(5) The semiconductor device according to any of (1) to (4) above, having a plurality of the semiconductor elements on the insulating substrate.

(6) A semiconductor stacked module structure, wherein a plurality of the semiconductor devices according to any of (1) to (5) above are stacked in a direction perpendicular to main flat surfaces of the semiconductor devices, by connecting an external electrode formed on the first metal thin film wire layer of a semiconductor device and an exposed portion on the second metal thin film wire layer of another semiconductor device.

(7) A stacked module structure, wherein the structure is formed by stacking at least one or more other semiconductor device or electronic component, which is electrically connected to an exposed portion on the second metal thin film wire layer of the semiconductor device according to any of (1) to (5) above.

(8) A method of manufacturing a semiconductor device, the method including:

a step of disposing a plurality of semiconductor elements by positioning the elements such that element circuit surfaces thereof face upwards, on one main surface of an insulating substrate, and fixing the surfaces on the opposite side to the element circuit surfaces of the semiconductor elements, to an insulating substrate;

a step of forming a first insulating material layer (A) on the element circuit surfaces of the semiconductor elements and the insulating substrate;

a step of forming openings in the first insulating material layer (A);

a step of forming a first metal thin film wire layer, portions of which extend to a peripheral region of the semiconductor elements, on the first insulating material layer (A), and forming conducting sections which are electrically connected with electrodes arranged on the element circuit surfaces of the semiconductor elements inside the openings in the first insulating material layer (A);

a step of forming a first insulating material layer (B) on top of the first metal thin film wire layer, the conducting sections and the first insulating material layer (A);

a step of forming openings passing through the insulating substrate and reaching the first metal thin film wire layer on the first insulating material layer (A);

a step of forming a second metal thin film wire layer by forming a metal thin film on the surface of the insulating substrate on the opposite side to the surface where the semiconductor elements are disposed and on the surface of the openings passing through the insulating substrate, and of forming vias to electrically connect the second metal thin film wire layer and the first metal thin film wire layer;

a step of forming the second insulating material layer on the second metal thin film wire layer;

a step of forming external electrodes on the first metal thin film wire layer; and a step of separating semiconductor devices including one or a plurality of semiconductor chips by cutting the insulating substrate, the first insulating material layer and the second insulating material layer, at prescribed positions.

(9) A method of manufacturing a semiconductor stacked module structure, wherein using a plurality of semiconductor devices according to any of (1) to (5) above, said one or more semiconductor devices are stacked in a direction perpendicular to main flat surfaces of the semiconductor devices, by electrically connecting the external electrode formed on the first metal thin film wire layer of one of the semiconductor devices with the second metal thin film wire layer exposed on the insulating substrate of another one of the semiconductor devices.

(10) A method of manufacturing a stacked module structure, wherein one or more other semiconductor device and/or electronic component is stacked in a direction perpendicular to main flat surfaces of the semiconductor devices, by electrically connecting the other semiconductor device or electronic component to the exposed portion on the second metal thin film wire layer of the semiconductor device according to any of (1) to (5) above.

Advantages of the Invention

By means of the present invention, it is possible to provide a semiconductor device, a semiconductor stacked module structure, a stacked module structure and a method of manufacturing these, which have a structure comprising electrodes passing between the front and rear surfaces, which enable vertical stacking structure such as a POP structure, which enable LSI chips of different sizes stacked vertically with ease, and which enable wider application.

The semiconductor device according to the present invention does not require previous patterning of metal wires on an insulating substrate, and therefore it is possible to use a common insulating substrate, regardless of the semiconductor elements to be mounted, and the semiconductor devices or components to be stacked, and general applicability is excellent. Moreover, since the formation of wires on the front surface of the insulating substrate (supporting plate) is performed after forming the first metal thin film wire layer, then formation of a protective layer on the surface of the insulating substrate in order to protect the wiring is not necessary.

BRIEF DESCRIPTION OF THE DRAWINGS

FIG. 2-1 A schematic diagram (1) showing one example of a method of manufacturing a semiconductor device relating to the present invention;

FIG. 2-2 A schematic diagram (2) showing one example of a method of manufacturing a semiconductor device relating to the present invention;

DETAILED DESCRIPTION OF THE PREFERRED EMBODIMENTS

Modes of the present invention are described below. In the following description, the embodiments are explained with reference to the drawings, which are provided for illustrative purposes, the present invention not being limited to these drawings.

First Embodiment

Figure 1:
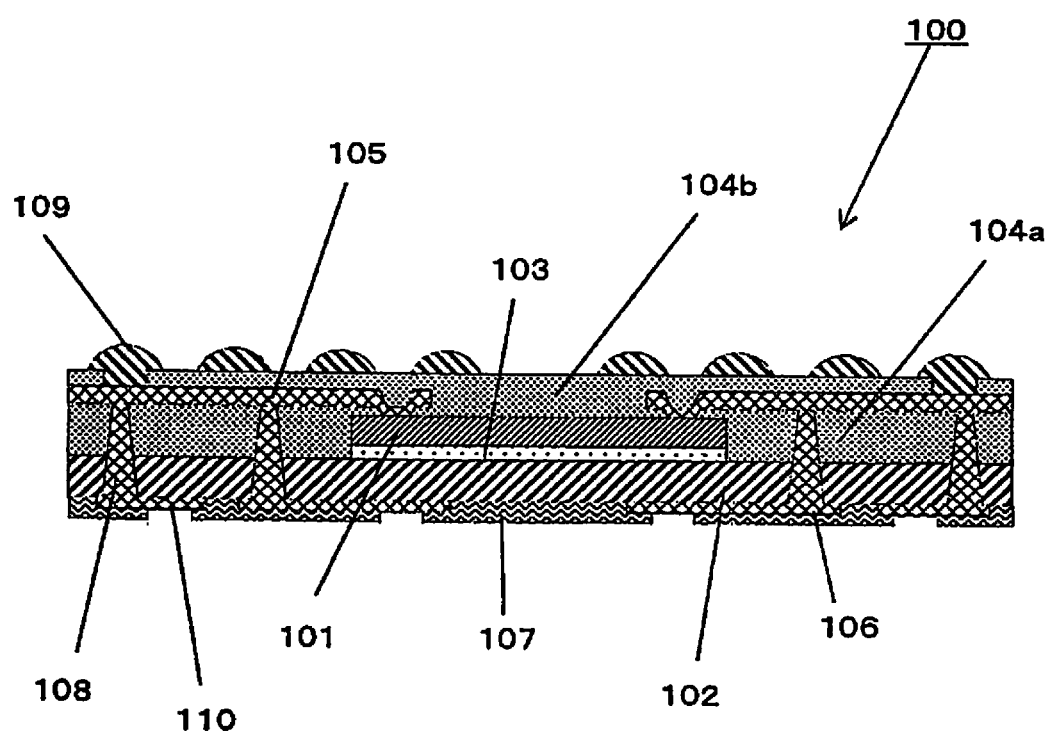
[FIG. 1] A cross-sectional diagram showing a first embodiment of a semiconductor device relating to the present invention.

FIG. 1 is a vertical cross-sectional diagram of a semiconductor device according to a first embodiment which comprises a basic composition of a semiconductor device relating to the present invention.

The semiconductor device 100 comprises an insulating substrate 102 constituted by a cured-resin body, a semiconductor element 101 is arranged on one main surface of the insulating substrate 102, with an element circuit surface having electrodes (not illustrated) facing upwards, and the surface on the opposite side to the element circuit surface (the rear surface) is affixed to the insulating substrate 102 by adhesive 103. The adhesive 103 is not limited in particular, and may be a liquid or film, etc., and can employ a commonly known material, as appropriate."

A first insulating material (A) 104a is provided on top of the element circuit surface of the semiconductor element 101 and the insulating substrate 102 peripheral to same. Furthermore, a first metal thin film wire layer 105, portions of which are exposed at an external surface, is provided on top of the insulating material layer (A) 104a, and a first insulating material layer (B) 104b is provided on top of the first metal thin film wire layer 105.

The first metal thin film wire layer 105 is connected electrically to electrodes (not illustrated) on the semiconductor element 101. Moreover, external electrodes 109 are provided on the portions of the first metal thin film wire layer 105 which are exposed on the external surface. For the external electrodes 109, it is possible to use solder balls, conductive paste, solder paste, or the like, for example. The semiconductor device 100 relating to the present invention can be connected to another electronic component, and the like, by this external electrodes 109.

Furthermore, a second metal thin film wire layer 106 of which one portion is exposed on an external surface is formed on the main surface of the insulating substrate 102 on the side where the semiconductor element 101 is not mounted, and a second insulating material layer 107 is provided further on top of the second metal thin film wire layer 106. The semiconductor device 100 relating to the present invention and another electronic component, or the like, can be connected electrically by portions 110 of the second metal thin film wire layer 106 which are exposed on the external surface.

Moreover, vias 108 which pass through the insulating substrate 102 and electrically connect the first metal thin film wire layer 105 and the second metal thin film wire layer 106 are provided in the semiconductor device 100 relating to the present invention. Through holes are formed in the insulating substrate 102 in order to provide the vias 108 as described above, and therefore it is possible to use an organic material which has insulating properties and high machining strength, as the material of the insulating substrate 102. For example, it is possible to use a composite material of glass cloth impregnated with resin, as an insulating substrate 102 of this kind.

By adopting the structure described above in the semiconductor device 100 relating to the present invention, the second metal thin film wire layer 106, the electrodes (not illustrated) arranged on the element circuit surface of the semiconductor element 101, the first metal thin film wire layer 105, the vias 108, and the external electrodes 109 formed on the first metal thin film wire layer are respectively connected electrically.

In other words, in the semiconductor device 100 relating to the present invention, the external electrodes 109 on one main surface, and the portions 110 wherein the second metal thin film wire layer 106 on the other main surface is exposed on the external surface are electrically connected via a circuit inside the semiconductor device, and therefore it is possible to achieve a vertical stacked structure, such as a POP structure, and even LSI chips of different sizes can easily be stacked vertically.

Moreover, as described below, the second metal thin film wire layer 106 on the insulating substrate 102 does not require previous patterning on the insulating substrate 102. Consequently, a common insulating substrate can be used, regardless of semiconductor element to be mounted, and regardless of semiconductor devices or components to be stacked, and therefore excellent general applicability can be achieved. Furthermore, since the second metal thin film wire layer 106 is formed after forming the first metal thin film wire layer 105, then it is not necessary to form a protective layer on the surface of the insulating substrate 102, for the purpose of protecting the wiring, and the manufacturing steps can be simplified and manufacturing costs can be reduced.

The present embodiment is described with reference to a semiconductor device having one semiconductor element 101 on the insulating substrate 102, but a case where a plurality of semiconductor elements 101 are provided on the insulating substrate 102 is also an embodiment of the present invention.

Figures 1, 2:
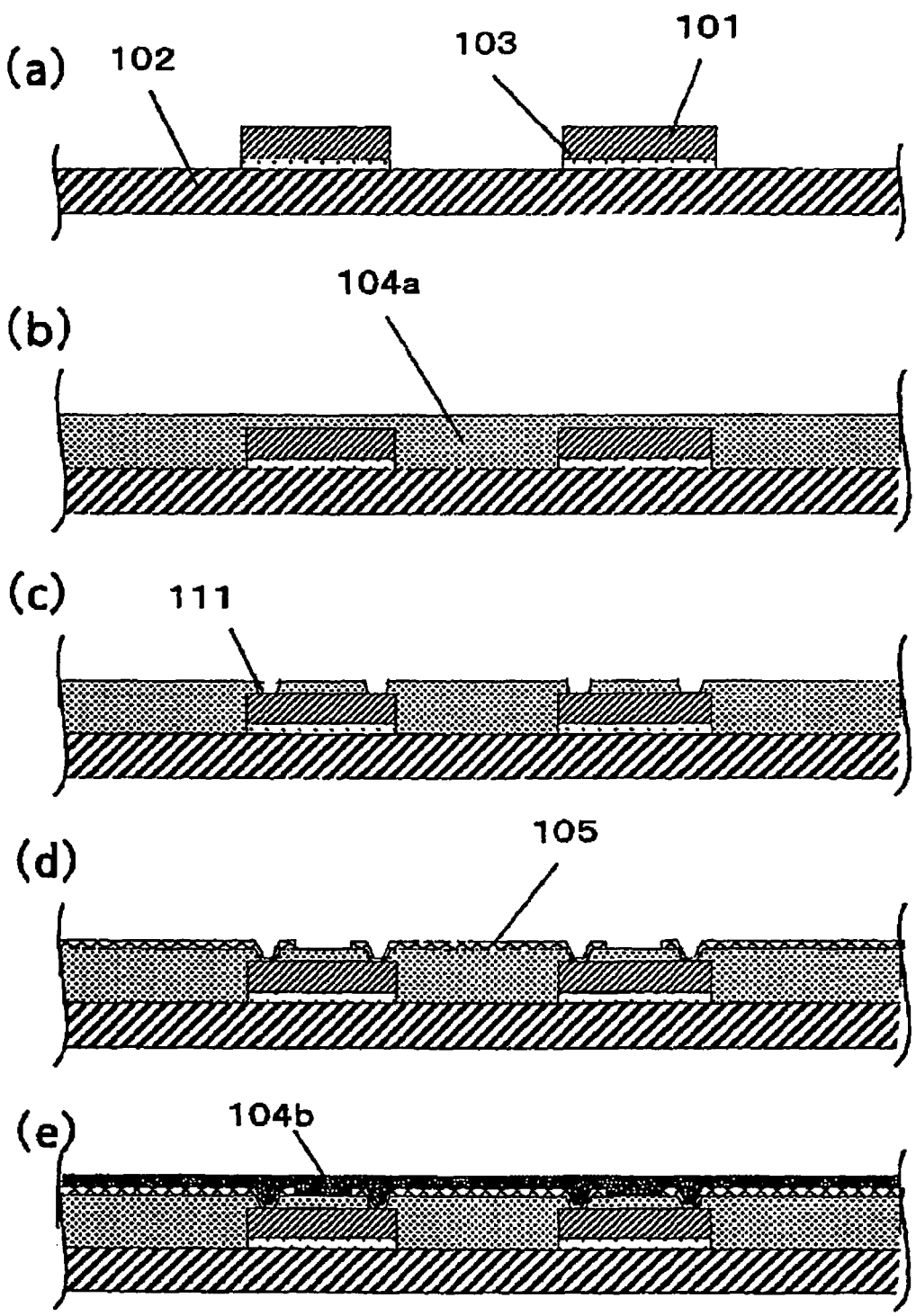
Figure 2:
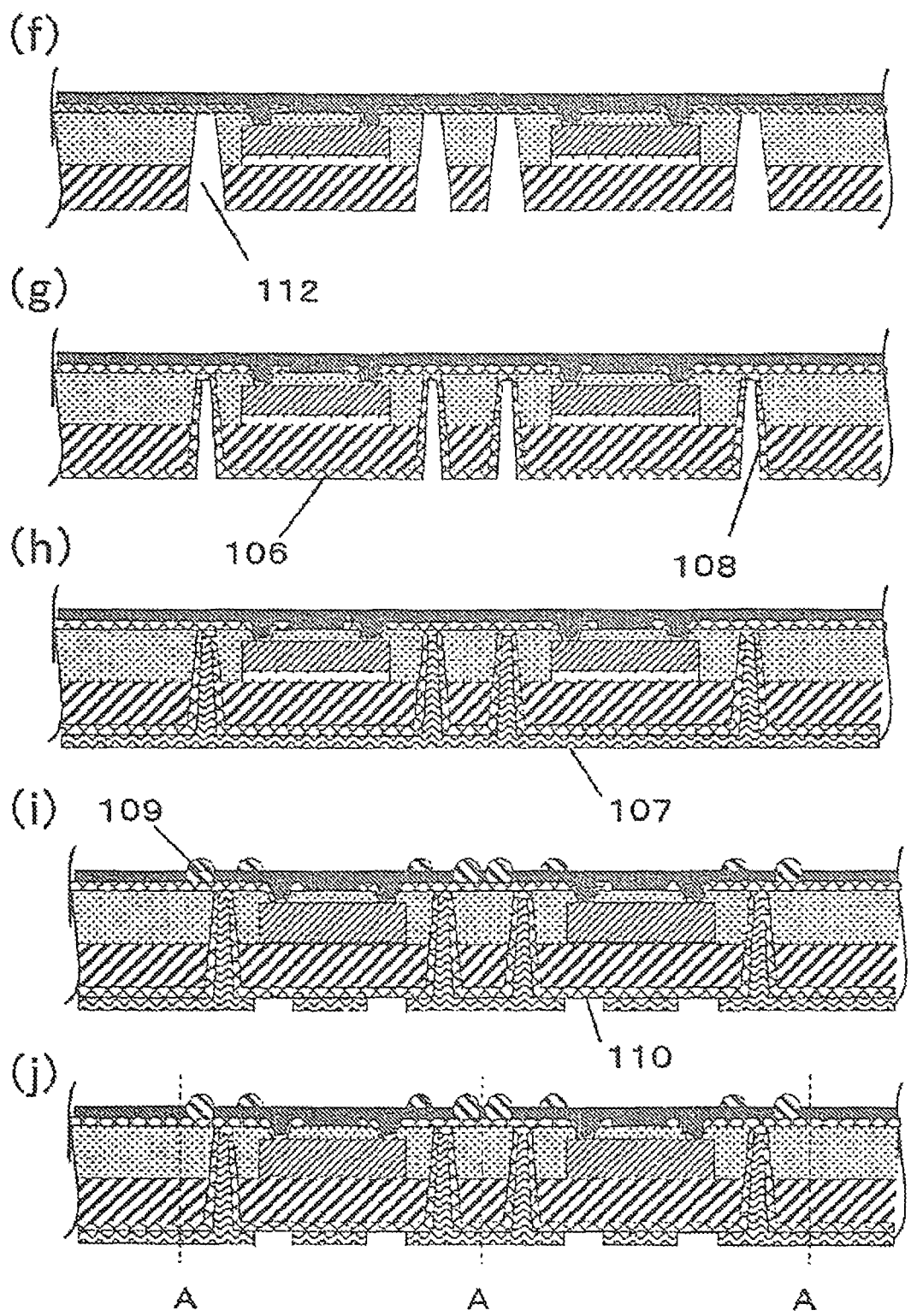

One example of a method of manufacturing the semiconductor device 100 relating to the present invention described above is explained below with reference to FIG. 2.

In the method of manufacture described below, the insulating substrate 102 is taken to be much larger than the size of the semiconductor element 101, a plurality of semiconductor elements 101 are mounted on the insulating substrate 102 respectively at intervals apart from each other, a plurality of semiconductor devices are manufactured simultaneously by prescribed processing steps, and it is finally divided up into individual semiconductors to obtain a plurality of semiconductor devices.

In this way, it is possible to greatly restrict manufacturing costs by simultaneously manufacturing a plurality of semiconductor devices.

Firstly, as shown in FIG. 2A, a plurality of semiconductor elements 101 are fixed onto one main surface of the insulating substrate 102, using adhesive 103. In this case, the main surface on the opposite side and the insulating substrate 102 are affixed in such a manner that the element circuit surfaces of the semiconductor elements 101 are facing upwards. Furthermore, the plurality of semiconductor elements 101 are arranged respectively at prescribed intervals apart.

For the insulating substrate 102, it is possible to use an organic material having insulating properties and high machining strength, and for example, it is desirable to use a composite material having, for example, a glass cloth as a base material, which is impregnated with thermocurable resin, such as epoxy resin. Furthermore, there are no particular restrictions on the adhesive 103, which may be in the form of a liquid or film, etc., and a commonly known material can be used, as appropriate.

Subsequently, as shown in FIG. 2B, a first insulating material layer (A) 104a is formed on the element circuit surfaces of the semiconductor elements 101, and the insulating substrate 102 peripheral to same.

For the insulating material, it is possible to use an insulating resin, such as thermocurable resin, for example. The supply of the insulating material can be performed by using an application method using a spin coater, a printing method using a squeegee, a method for laminating using resin in the form of a film, and the like. For the insulating resin, it is also possible to use a photosensitive resin.

Next, as shown in FIG. 2C, openings 111 are provided in portions of the first insulating material layer (A) 104a on the semiconductor element 101. Accordingly, portions of the element circuit surfaces of the semiconductor elements 101 are exposed, and can be used to function as electrodes for electrically connecting the semiconductor elements 101 and other elements. There are no particular restrictions on the means for forming the openings 111, for example, the openings 111 can be formed by exposing and developing a photosensitive resin, or by using a laser.

As shown in FIG. 2D, a first metal thin film wire layer 105 is formed on the first insulating material layer (A) 104a. The first metal thin film wire layer 105 can be formed by forming an under layer (seed layer) by vapor deposition (sputtering) or electroless plating, or the like, over the whole upper surface of the first insulating material layer (A) 104a, and then carrying out electroplating. In this case, as shown in FIG. 2D also, a conductive metal thin film layer is formed by plating also on the side walls of the openings 111 of the first insulating material layer (A) 104a, and conducting sections which electrically connect the semiconductor elements 101 and the first metal thin film wire layer 105. By patterning by photolithography the metal thin film layer formed on the whole surface, it is possible to form a first metal thin film wire layer 105 of which portions extend to the peripheral regions of the semiconductor elements 101.

The conducting sections may be buried by a conductive material, and the insulating material which creates the first insulating material layer (B) 104b described below may be formed on top of the plating film formed on the side walls. When the conducting sections are buried by a conductive material, the conductive material may be filled in simultaneously during the plating process, or a conductive paste may be filled in after forming a plating film on the side walls.

There are no particular restrictions on the patterning by photolithography described above, and a pattern can be formed by a subtractive method such as that described below, for example. It is possible to form a photosensitive resist layer on the metal thin film layer, to expose and develop this layer using a mask having a prescribed pattern, and to then etch the metal thin film layer. Furthermore, after forming the first metal thin film wire layer 105, the under layer (seed layer) is removed by etching.

Subsequently, as shown in FIG. 2E, a first insulating material layer (B) 104b is formed on the first metal thin film wire layer 105, the conducting sections, the first insulating material layer (A) 104a. As described below, the insulating material which forms the first insulating material layer (A) 104a and the first insulating material layer (B) 104b may be the same material or different materials, but in this first embodiment, the same material is used.

After forming the first insulating material layer (B) 104b, opening sections for providing external electrodes 109 are formed in the first insulating material layer (B) 104b.

Next, as shown in FIG. 2F, openings are formed to pass through the insulating substrate 102 and the first insulating material layer (A) 104a, reaching to the first metal thin film wire layer 105. These openings are formed by a miniature drill or laser, for example.

As shown in FIG. 2G, the second metal thin film wire layer 106 is formed on the surface (rear surface) of the insulating substrate 102 on the opposite side to the side where the semiconductor elements 101 are mounted. The second metal thin film wire layer 106 can be formed by similar means to the first metal thin film wire layer 105. More specifically, for example, a metal thin film layer is created by forming an under layer {seed layer) by vapor deposition (sputtering), or electroless plating, or the like, over the whole rear surface of the insulating substrate 102, and then carrying out electroplating. In this case, as shown in FIG. 2G, a conductive metal thin film layer is formed by also plating on the side walls of the openings which pass through the insulating substrate 102 and the first insulating material layer (A) 104a. Accordingly, vias 108 which electrically connect the first metal thin film wire layer 105 and the second metal thin film wire layer are formed. By using photolithography to pattern the metal thin film layer which has been formed over the whole rear surface of the insulating substrate 102, it is possible to form a second metal thin film wire layer 106.

In this way, the second metal thin film wire layer 106 which is electrically connected to the first metal thin film wire layer 105 and the semiconductor elements 101 is formed.

The vias 108 may be buried by conductive material, or an insulating material forming the second insulating material layer 107 may be provided on a plating film formed on the side walls of the openings. When the vias 108 are buried by conductive material, the conductive material may be filled in simultaneously, at the same time as plating, or a conductive paste may be filled in after a plating film has been formed on the side walls. If the plating film is sufficiently thick, and the electrical connection is good, then filling with the conductive material can be omitted.

Subsequently, a second insulating material layer 107 is formed on the second metal thin film wire layer 106, as shown in FIG. 2H. In this case, if the vias 108 are not buried in the conductive material, then the vias 108 will become filled with the insulating material used to form the second insulating material layer 107.

There are no particular restrictions on the conductive material used to form the second insulating material layer 107, and it is possible to employ a commonly known insulating resin, or the like. Furthermore, it is also possible to use the solder resist described above, or the like, to act as a protective film for protecting the second metal thin film wire layer 106. The solder resist can be supplied by roller coater, or the like, if in the form of a liquid, and as a laminate or by press, or the like, if in the form of a film.

As shown in FIG. 2I, portions of the second insulating material layer 107 are then removed to expose portions of the second metal thin film wire layer 106. Consequently, the semiconductor device of the present invention can be connected electrically to another component or element via the exposed portions.

Furthermore, opening sections for providing the external electrodes 109 are formed by removing portions of the first insulating material layer (B) 104b. Conductive material is then provided in the openings to form the external electrodes 109. A material which conducts electricity, such as solder balls, conductive paste, solder paste, or the like, is used as the conductive material.

Finally, it is possible to obtain the semiconductor device 100 according to the first embodiment of the present invention by dividing into respective individual pieces along the A-A cutting lines shown in FIG. 2J.

Second Embodiment

Figure 3:
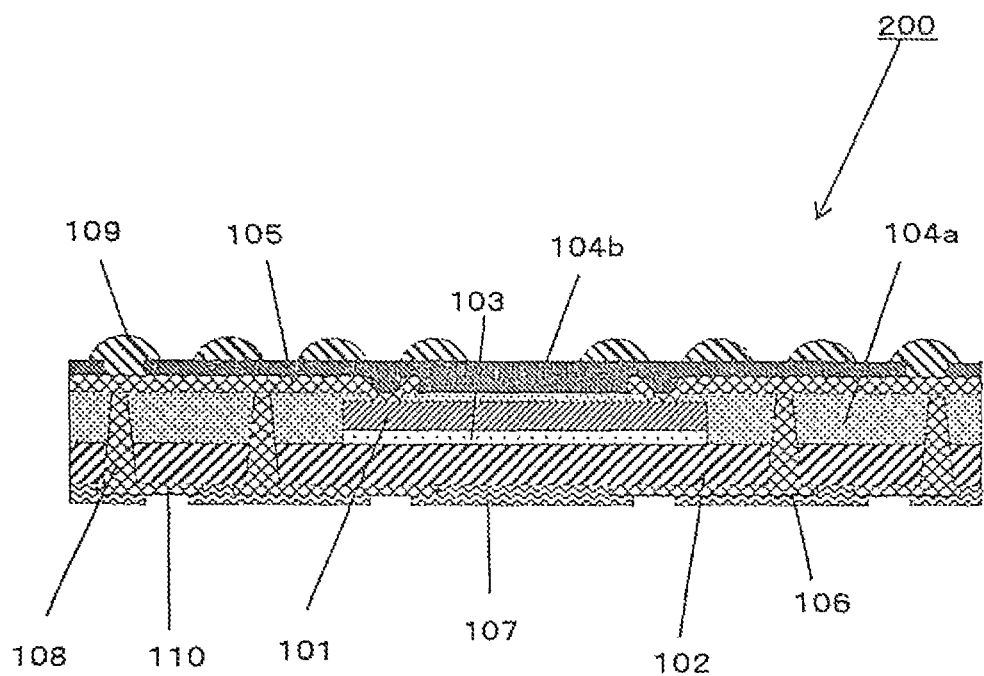
FIG. 3 A cross-sectional diagram showing a second embodiment of a semiconductor device relating to the present invention.

FIG. 3 is a cross-sectional diagram showing a second embodiment of the semiconductor device according to the present invention.

The semiconductor device 200 according to the second embodiment is an example in which the first insulating material layer (A) 104a and the first insulating material layer (B) 104b of the first embodiment described above are made from different insulating materials. The first insulating material layer (A) 104a and the first insulating material layer (B) 104b may be made from the same insulating material, as described above, or made from different insulating materials.

If the first insulating material layer (A) and the first insulating material layer (B) are made from different insulating materials, as in the second embodiment, then the first insulating material layer (B) 104b on the outermost surface can also be made from solder resist, or the like, to serve as a protective film. The solder resist can be supplied by roller coater, or the like, if in the form of a liquid, and as a laminate or by press, or the like, if in the form of a film.

Third Embodiment

Figure 4:
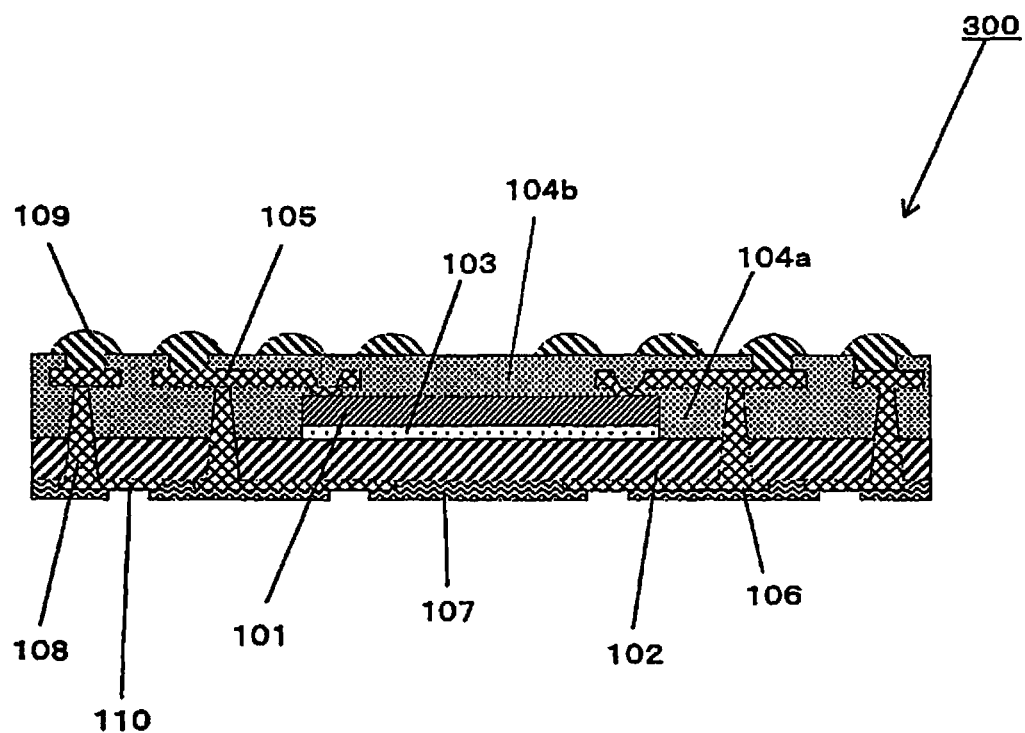
FIG. 4 A cross-sectional diagram showing a third embodiment of a semiconductor device relating to the present invention.

FIG. 4 is a cross-sectional diagram showing a third embodiment of the semiconductor device according to the present invention.

The semiconductor device 300 according to the third embodiment is an example of a semiconductor device having a first metal thin film wire layer which is connected electrically to the second metal thin film wire layer, but is not connected electrically to the semiconductor element. In the third embodiment, the composition is similar to that of the semiconductor device 100 according to the first embodiment, apart from the fact that a first metal thin film wire layer 105 which is not connected electrically to the semiconductor element 101 in this way is provided. Consequently, it is possible to diversify the electric circuits inside the semiconductor device 300. As described hereinafter, the individual wiring of the semiconductor devices and other electronic components stacked on the semiconductor device of the present invention can be output from the external terminals.

Fourth Embodiment

Figure 5:
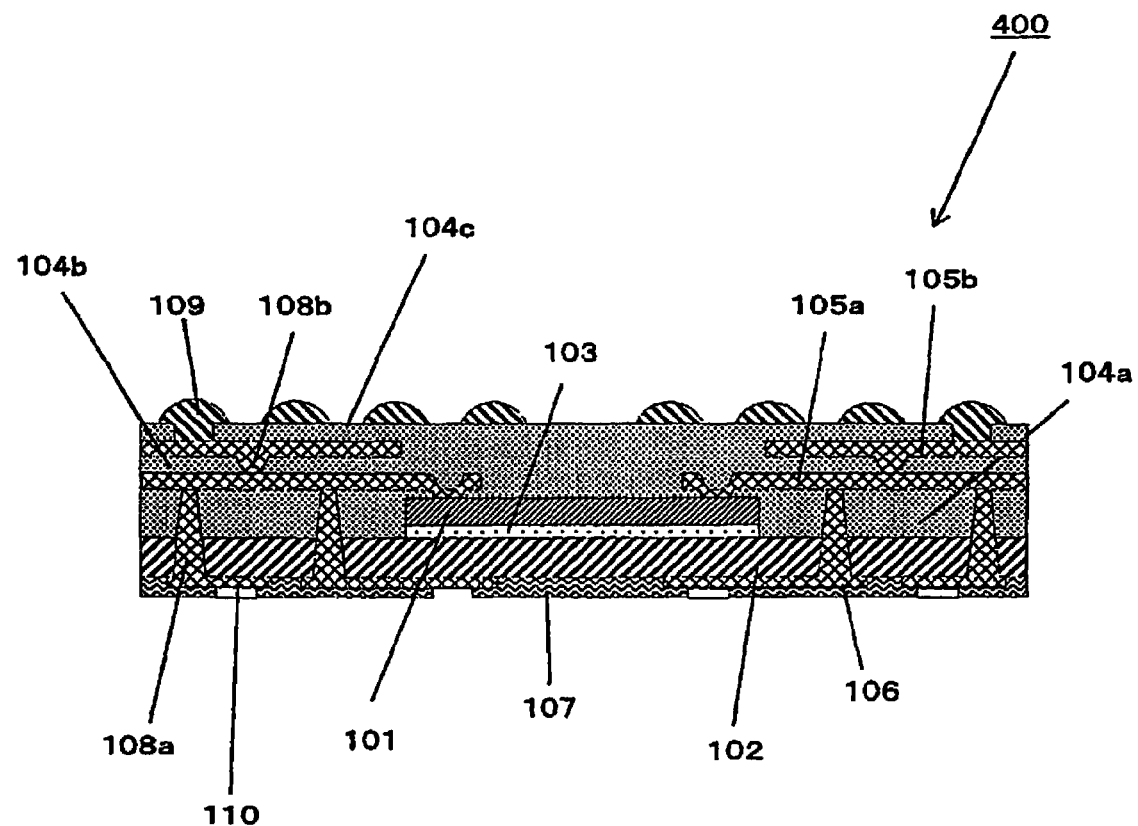
FIG. 5 A cross-sectional diagram showing a fourth embodiment of a semiconductor device relating to the present invention.

FIG. 5 is a cross-sectional diagram showing a fourth embodiment of the semiconductor device according to the present invention.

The semiconductor device 400 according to this fourth embodiment is an example of a semiconductor device in which the first metal thin film wire layer 105 is formed as a plurality of layers. The fourth embodiment has a similar composition to the semiconductor device 100 according to the first embodiment, apart from the fact that a plurality of first metal thin film wire layers are provided in this way.

To give a more specific description, the semiconductor device 400 according to the fourth embodiment is a semiconductor device having a first metal thin film wire layer (A) 105a, a portion of which extends to peripheral regions of the semiconductor elements 101 on the first metal thin film wire layer (A) 104a, a first insulating material layer (B) 104b formed on top of the first metal thin film wire layer (A) 105a, a first metal thin film wire layer (B) 105b formed on the first insulating material layer (B) 104b and electrically connected to the first metal thin film wire layer (A) 104a, and a first insulating material layer (C) 104c formed on the first metal thin film wire layer (B) 105b. Portions of the first metal thin film wire layer (B) 105b are exposed externally and external electrodes 109 are provided on these portions.

In the semiconductor device 400 having the composition described above, a greater diversity of the electric circuitry inside the semiconductor device can be achieved. More specifically, for instance, it is possible to arrange external electrodes of different potentials three-dimensionally on the electrode pads of the semiconductor elements, without shorting.

In order to manufacture the semiconductor device 400 of this kind, after FIG. 2E above, portions of the first metal thin film wire layer 105 are exposed by forming openings in portions of the first insulating material layer (B) 104b. A first metal thin film wire layer (B) 105b is formed by a means such as plating, as described above, on the first insulating material layer (B) 104b. Consequently, a plating film is formed on the side walls of the openings, and vias (B) 108b electrically connecting the first metal thin film wire layer (A) 105a and the first metal thin film wire layer (B) 105b are formed.

A first insulating material layer (C) 104c is then formed on the first metal thin film wire layer (B) 105b, portions thereof are removed, thereby exposing portions of the first metal thin film wire layer (B) 105b, and external electrodes 109 may be formed on these portions. Moreover, the first insulating material layer (A) 104a, the first insulating material layer (B) 104b and the first insulating material layer (C) 104c may be respectively made from the same insulating material or from different insulating material layers.

In FIG. 5, a case is illustrated in which there are two first metal thin film wire layers 105, but the semiconductor device according to the present invention is not limited to this and it is also possible to form a plurality of the first metal thin film wire layers. In this case, it is possible to achieve a multiple layer composition by alternately forming the first metal thin film wire layer and the first insulating material layer described above.

Fifth Embodiment

Figure 6:
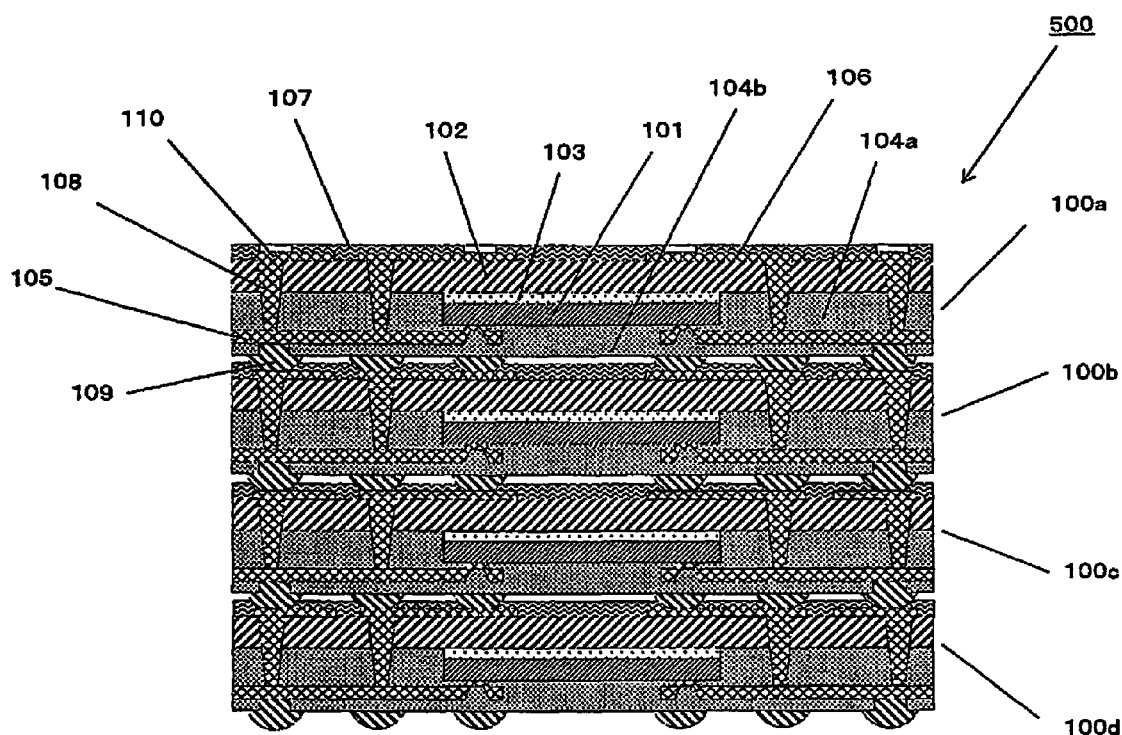
FIG. 6 A cross-sectional diagram showing a fifth embodiment of a semiconductor stacked module structure relating to the present invention.
Figure 7:
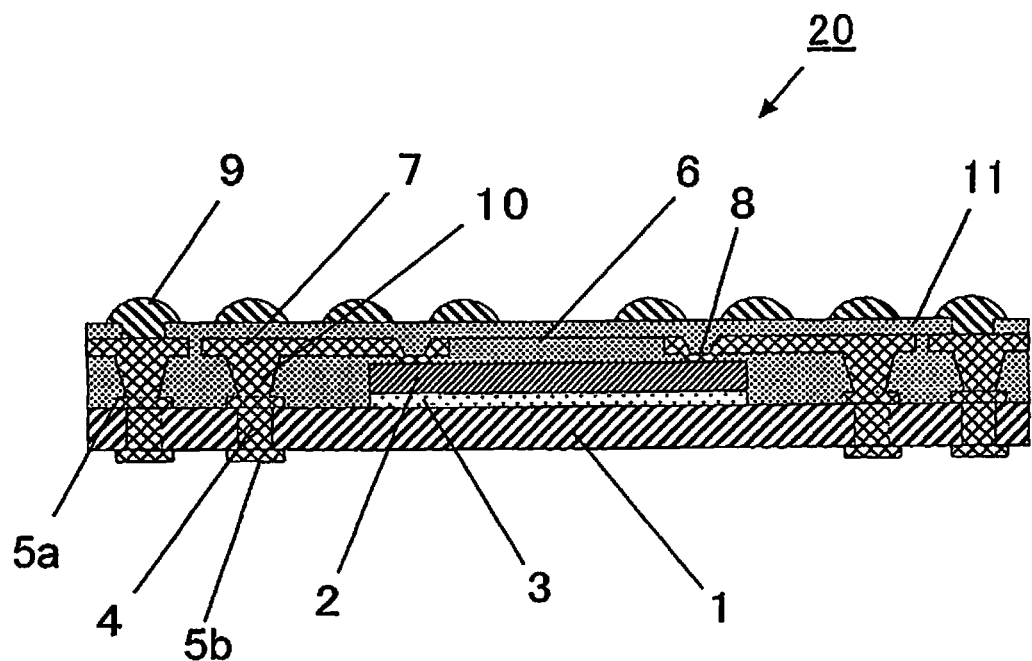
FIG. 7 A cross-sectional diagram showing a reference example of a semiconductor device.
Figure 8:
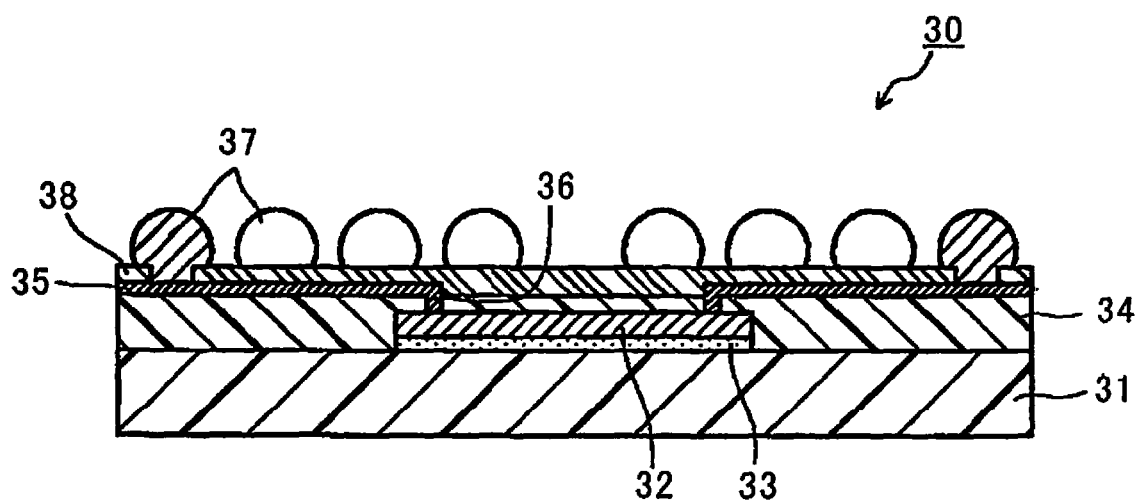
FIG. 8 A cross-sectional diagram showing a structure of a conventional semiconductor device.
Figure 9:
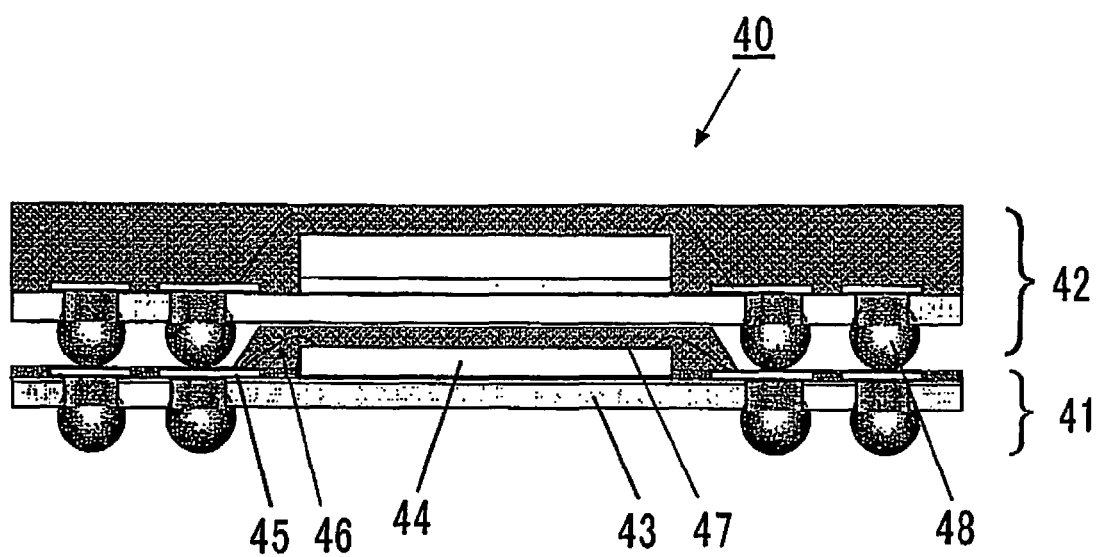
FIG. 9 A diagram showing a structure of a semiconductor device having a conventional POP structure.
Figure 10:
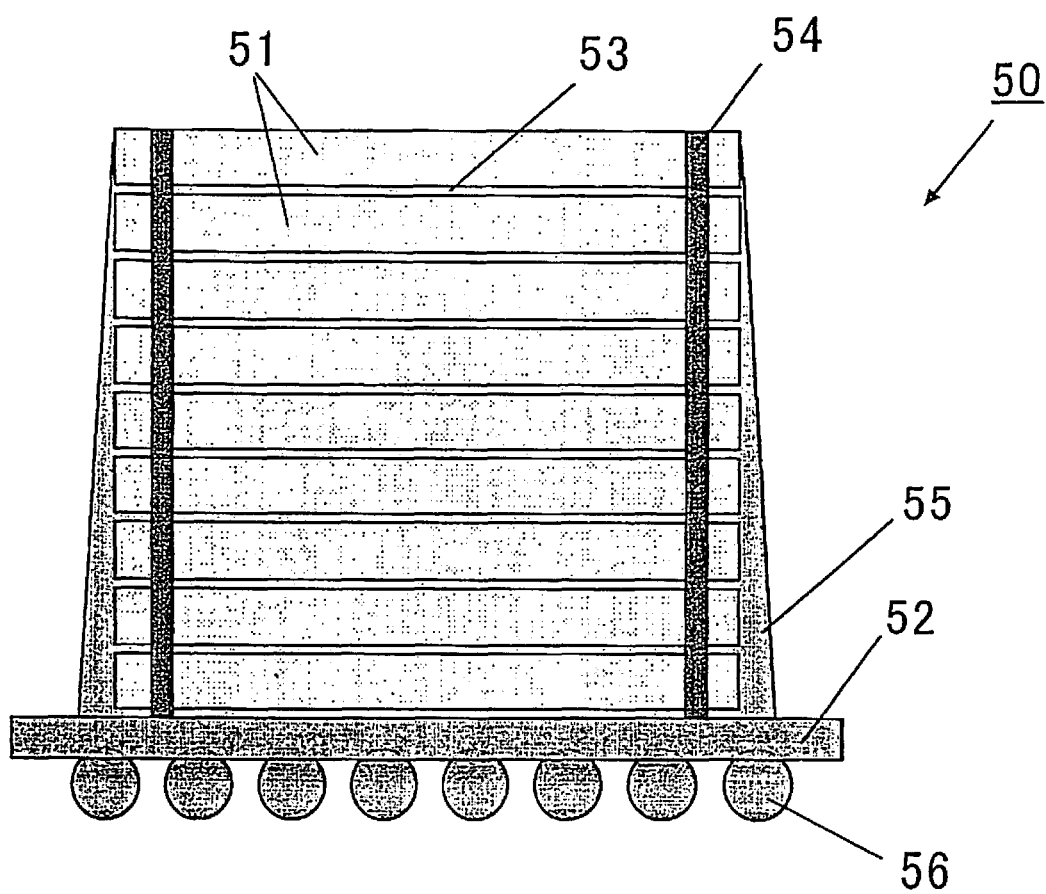
FIG. 10 A diagram showing a structure of a semiconductor device having a conventional TSV structure.

FIG. 6 is a cross-sectional diagram showing a fifth embodiment of a semiconductor stacked module structure according to the present invention.

The semiconductor stacked module structure 500 relating to the present invention is an example of a structure in which four of the semiconductor devices 100 according to the first embodiment are stacked vertically. In this semiconductor stacked module structure 500, external electrodes 109 formed on top of the first metal thin film wire layer 105 of a semiconductor device are connected with exposed portions of the second metal thin film wire layer 106 on another semiconductor device, whereby four semiconductor devices are stacked in a direction perpendicular to the main flat surfaces of the semiconductor devices.

In the fifth embodiment, an example is given in which four semiconductor devices are stacked, but the semiconductor stacked module structure relating to the present invention is not limited to this and it is possible to stack a greater number of semiconductor devices. Moreover, apart from semiconductor devices, it is also possible to achieve a stacked module structure by stacking other electronic components. In this case, the external electrodes 109 and/or the exposed portions of the second metal thin film wire layers of the semiconductor devices are electrically connected to other semiconductor devices or electronic components, and one or more other semiconductor device and/or electronic component may be stacked in a direction perpendicular to the main flat surfaces of the semiconductor devices.

In this way, by using the semiconductor device according to the present invention as one compositional unit of a semiconductor stacked module structure or a stacked module structure, then it is possible to achieve a semiconductor stacked module structure or a stacked module structure having a desired number of levels, without providing through electrodes in the semiconductor elements, as in a TSV structure, even if the individual semiconductor elements are of different sizes.

What is claimed is:

1. A method of manufacturing a semiconductor device, the method comprising the steps of:
   disposing a plurality of semiconductor elements by positioning the elements such that element circuit surfaces thereof face upwards, on one main surface of an insulating substrate, and fixing the surfaces on the opposite side to the element circuit surfaces of the semiconductor elements, to an insulating substrate;
   forming a first insulating material layer on the element circuit surfaces of the semiconductor elements and the insulating substrate;
   forming openings in the first insulating material layer;
   forming a first metal thin film wire layer, portions of which extend to a peripheral region of the semiconductor elements, on the first insulating material layer, and forming conducting sections which are electrically connected with electrodes arranged on the element circuit surfaces of the semiconductor elements inside the openings in the first insulating material layer;
   forming a first insulating material layer on top of the first metal thin film wire layer, the conducting sections and the first insulating material layer;
   forming openings passing through the insulating substrate and reaching the first metal thin film wire layer on the first insulating material layer;
   forming a second metal thin film wire layer by forming a metal thin film on the surface of the insulating substrate on the opposite side to the surface where the semiconductor elements are disposed and on the surface of the openings passing through the insulating substrate, and of forming vias to electrically connect the second metal thin film wire layer and the first metal thin film wire layer;
   forming the second insulating material layer on the second metal thin film wire layer;
   forming external electrodes on the first metal thin film wire layer; and
   separating semiconductor devices including one or a plurality of semiconductor chips by cutting the insulating substrate, the first insulating material layer and the second insulating material layer, at prescribed positions.

* * * * *